United States Patent
Watanabe et al.

(10) Patent No.: US 7,847,405 B2
(45) Date of Patent: Dec. 7, 2010

(54) SEMICONDUCTOR DEVICE AND MANUFACTURING METHOD OF SEMICONDUCTOR DEVICE

(75) Inventors: Tadayoshi Watanabe, Kanagawa-ken (JP); Yumi Hayashi, Kanagawa-ken (JP); Takamasa Usui, Selkirk, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/463,167

(22) Filed: May 8, 2009

(65) Prior Publication Data

US 2009/0289366 A1 Nov. 26, 2009

(30) Foreign Application Priority Data

May 9, 2008 (JP) .......................... P2008-123903

(51) Int. Cl.
H01L 23/48 (2006.01)
H01L 23/52 (2006.01)
H01L 29/40 (2006.01)
H01L 27/10 (2006.01)
H01L 29/74 (2006.01)

(52) U.S. Cl. .................. 257/758; 257/211; 257/759; 257/760; 257/E21.016; 257/E21.017; 257/E21.018; 257/E21.019; 257/E21.02; 257/E21.021; 257/E21.507; 257/E21.575; 257/E21.576; 257/E21.577; 257/E21.579; 257/E21.584; 257/E21.627; 257/E21.641

(58) Field of Classification Search ................ 257/211, 257/758–760, E21.016–E21.021, E21.507, 257/E21.575–E21.577, E21.579, E21.584, 257/E21.627, E21.641

See application file for complete search history.

(56) References Cited

U.S. PATENT DOCUMENTS

| 6,150,270 | A | 11/2000 | Matsuda et al. ............ 257/687 |
|---|---|---|---|
| 6,661,094 | B2 * | 12/2003 | Morrow et al. ............. 257/758 |
| 7,067,418 | B2 * | 6/2006 | Huang et al. ............... 438/637 |
| 7,196,423 | B2 * | 3/2007 | Wu et al. .................... 257/774 |
| 7,345,352 | B2 * | 3/2008 | Matsumura et al. ......... 257/513 |
| 7,408,693 | B2 * | 8/2008 | Kissa et al. ................. 359/245 |
| 2007/0001307 | A1 | 1/2007 | Usui et al. .................. 257/758 |
| 2007/0018329 | A1 | 1/2007 | Oh et al. ..................... 257/762 |
| 2007/0035032 | A1 | 2/2007 | Tsumura et al. ............ 257/775 |
| 2008/0179753 | A1 * | 7/2008 | Won et al. ................... 257/773 |
| 2008/0246155 | A1 | 10/2008 | Hayashi et al. ............. 257/762 |
| 2009/0142919 | A1 * | 6/2009 | Noguchi et al. ............ 438/633 |

OTHER PUBLICATIONS

Self-Formed Barrier Technology using CuMn Alloy Seed for Copper Dual-Damascene Interconnect with porous-SiOC/porous-PAr Hybrid Dielectric, T. Watanabe, et al., Jun. 4, 2007.
Conference Proceedings AMC XXII © 2007 Materials Research Society, High Performance Ultra-Low-k (k=2.0/keff=2.4) Hybrid Dielectric/Cu Dual-Damascene Interconnects with Selective Barrier Layer for 32 nm-node, Y. Hayashi, et al. Oct. 17, 2006, p. 263-269.
U.S. Appl. No. 12/332,583, filed Dec. 11, 2008, Watanabe, et al.

* cited by examiner

*Primary Examiner*—Ida M Soward
(74) *Attorney, Agent, or Firm*—Oblon, Spivak, McClelland, Maier & Neustadt, L.L.P.

(57) ABSTRACT

In one aspect of the present invention, a semiconductor device may include an inter-wiring dielectric film in which a wiring trench is formed, a metal wiring layer formed in the wiring trench in the inter-wiring dielectric film, a first barrier layer formed on a side surface of the wiring trench, the first barrier layer being an oxide film made from a metal different from a main constituent metal element in the wiring layer, a second barrier layer formed on a side surface of the wiring layer, the second barrier layer having a Si atom of the metal used in the wiring layer, and a gap formed between the first barrier layer and the second barrier layer.

8 Claims, 13 Drawing Sheets

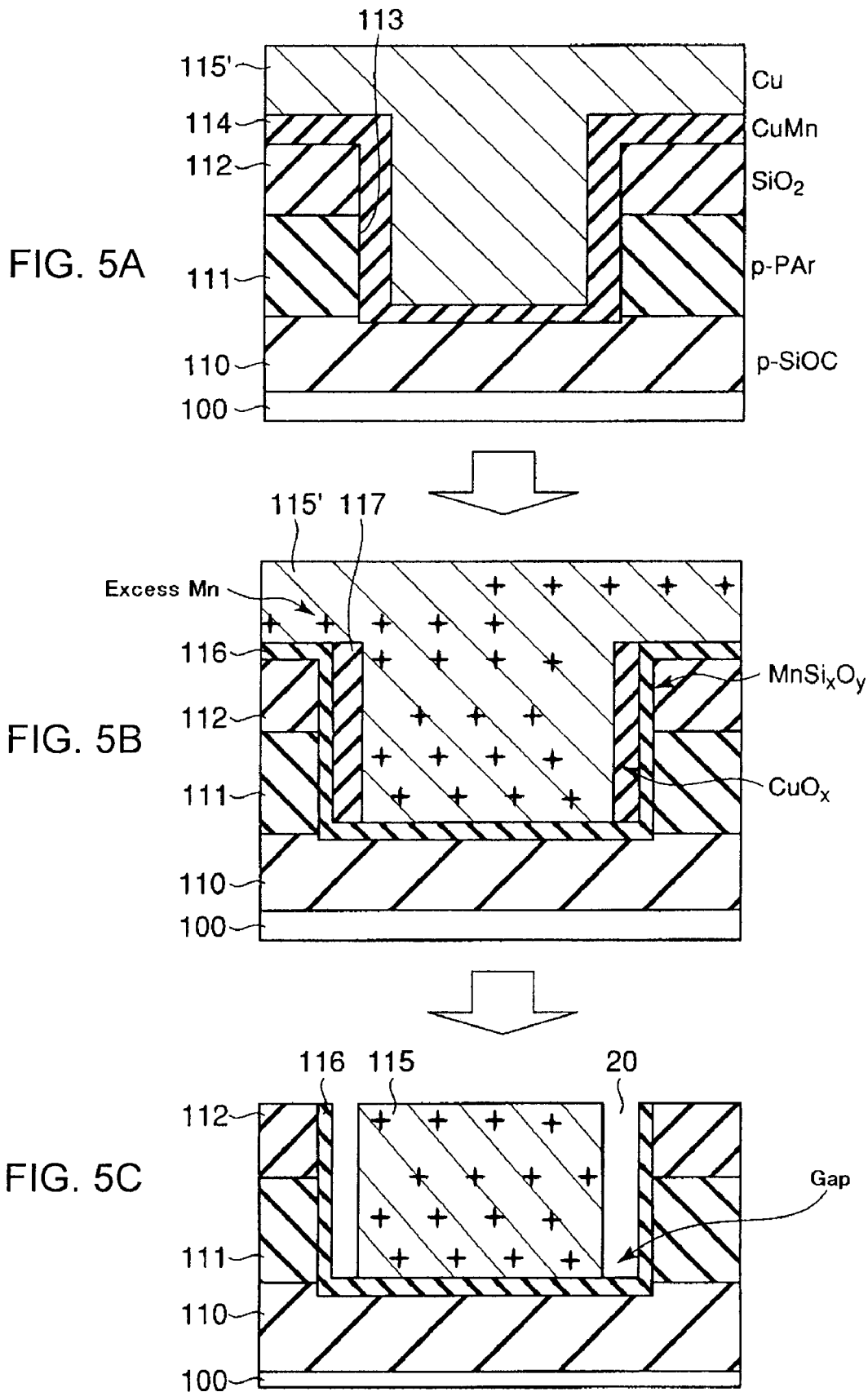

SEMICONDUCTOR DEVICE AND MANUFACTURING METHOD OF SEMICONDUCTOR DEVICE

CROSS REFERENCE TO RELATED APPLICATION

This application is based upon and claims the benefit of priority from Japanese Patent Application No. 2008-123903, filed on May 9, 2008, the entire contents of which are incorporated herein by reference.

BACKGROUND

A conventional process for forming LSI wiring is as follows. Firstly, an interlayer dielectric film is formed on a Si substrate. Then, a dielectric film and a cap dielectric film are deposited thereon as inter-wiring dielectric films, and trenches for forming wiring lines are formed in these inter-wiring dielectric films. Thereafter, the wiring trenches are filled with a barrier metal and a wiring material, and these fillings are processed by chemical mechanical polishing (CMP). Thereafter, a Cu diffusion prevention film is formed thereon, and thus Cu wirings each having a single layer are formed.

However, in this structure, a sidewall of the wiring material directly contacts the inter-wiring dielectric films, and thus moisture in the dielectric films may cause wiring metal corrosion. In particular, if the inter-wiring dielectric films are damaged during etching for forming the trenches, wiring metal corrosion is likely to be more serious. Meanwhile, a structure in which CuSiN cap films are formed on a top surface of the Cu wirings has been proposed. However, this structure cannot suppress wiring metal corrosion caused by moisture in the inter-wiring dielectric films.

SUMMARY

Aspects of the invention relate to an improved semiconductor device.

In one aspect of the present invention, a semiconductor device may include an inter-wiring dielectric film in which a wiring trench is formed, a metal wiring layer formed in the wiring trench in the inter-wiring dielectric film, a first barrier layer formed on a side surface of the wiring trench, the first barrier layer being an oxide film made from a metal different from a main constituent metal element in the wiring layer, a second barrier layer formed on a side surface of the wiring layer, the second barrier layer having a Si atom and a metal element in the wiring layer, and a gap formed between the first barrier layer and the second barrier layer.

In one aspect of the present invention, a semiconductor device may include an inter-wiring dielectric film in which a wiring trench is formed, a metal wiring layer formed in the wiring trench in the inter-wiring dielectric film, a water-resistant barrier layer formed on a side surface of the wiring layer and an upper surface of the wiring layer and a gap formed between the water-resistant barrier layer and a side surface of the wiring trench.

In another aspect of the invention, a method of manufacturing semiconductor device may include forming an inter-wiring dielectric film having a wiring trench, forming a precursor having a metal M2 on the wiring trench in the inter-wiring dielectric film, forming a wiring layer having a metal M1 on the precursor in the wiring trench of the inter-wiring dielectric film, the metal M1 being different from the metal M2, forming a first barrier layer which is an oxide film made from the metal M2 on the side surface of the wiring trench, and an oxide film made from the metal M1 at an interface between the wiring layer and the first barrier layer, removing the oxide film made from the metal M1, and thereby forming gap between the wiring layer and the first barrier layer and forming a second barrier layer on a side surface of the wiring layer that are exposed by forming the gap.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

FIGS. 5A to 5C are schematic diagrams to illustrate a mechanism of forming barrier layers and gaps in the first embodiment.

DETAILED DESCRIPTION

Figure 1:
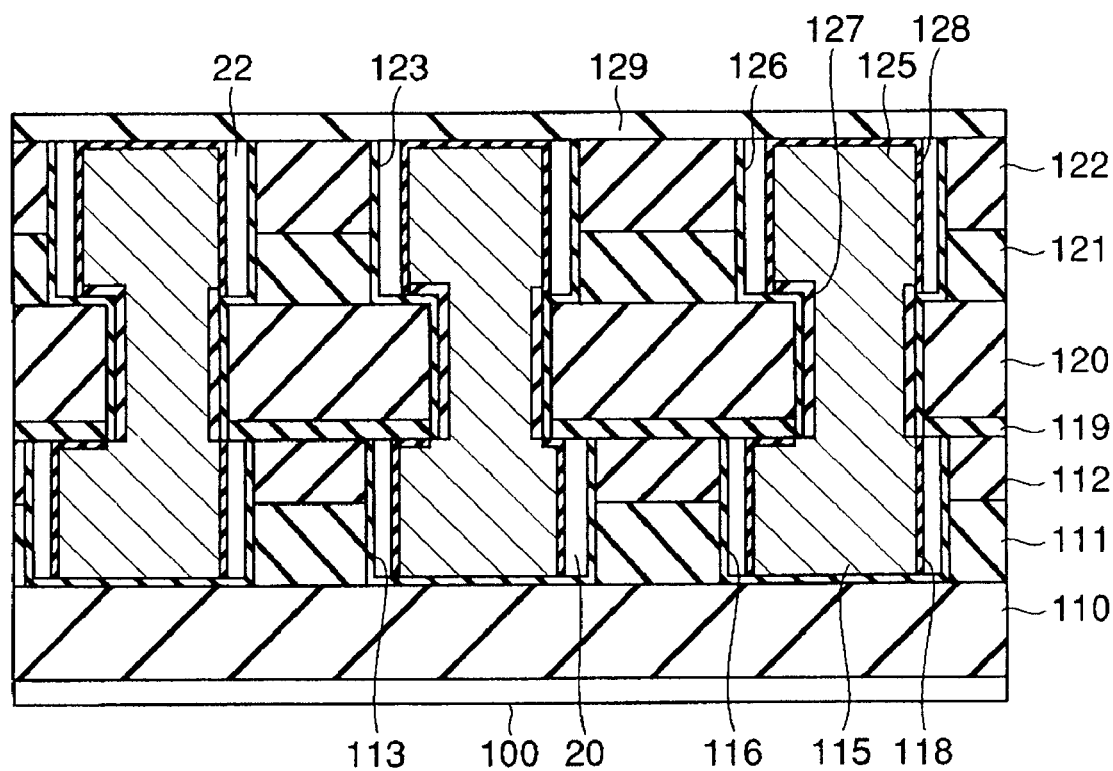
FIG. 1 is a cross-sectional view showing a wiring structure of a semiconductor device according to a first embodiment.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

First Embodiment

FIG. 1 is a cross-sectional view showing a wiring structure of a semiconductor device according to a first embodiment.

A first interlayer dielectric film (ILD film) 110 made of SiOC and SiO$_2$ is formed on a Si substrate 100. On the ILD film 110, a bulk dielectric film 111 and a cap dielectric film 112 are provided as first inter-wiring dielectric films. The bulk dielectric film 111 is a dielectric film having a low dielectric constant, such as a porous organic film. The cap dielectric film 112 is, for example, a SiO$_2$ film, and formed to protect the bulk dielectric film 111.

Wiring trenches 113 are formed in the inter-wiring dielectric films 111 and 112, and a Cu wiring 115 is formed in each of the trenches 113. Between the Cu wiring 115 and the sidewalls of the wiring trench 113, gaps 20 are provided. On the side surfaces of the wiring trenches 113, first barrier layers 116 made of MnOx films or MnSixOy films are formed. On the upper and side surfaces of the Cu wirings 115, second barrier layers 118 made of CuSiN are formed. In addition, a diffusion prevention film 119 made of SiOC or the like is formed on the first wiring layer. The second barrier layers 118 may function as a water-resistant film of the wiring layer 115.

A second ILD film 120 is provided on the diffusion prevention film 119. On the second ILD film 120, a bulk dielectric film 121 and a cap dielectric film 122 are deposited as second inter-wiring dielectric films. Wiring trenches 123 are formed in the inter-wiring dielectric films 121 and 122, and via holes are formed in the ILD film 120. A Cu wiring 125 is formed in each of the wiring trenches 123 and via contact is formed in the via holes in the ILD 120. Between the Cu wiring 125 and the sidewalls of the wiring trench 123, gaps 22 are provided. On the side surfaces of the wiring trenches 123, first barrier layers 126 made of MnOx films or MnSixOy films are formed. On the upper and side surfaces of the Cu wirings 125, second barrier layers 128 made of CuSiN are formed. The CuSiN film functions as a water-resistant film of the wiring 125.

In addition, in the via holes of the ILD film 120, CuOx films 127 are formed between each Cu wiring 125 and the adjacent barrier layers 126. A diffusion prevention film 129 made of SiOC or the like is formed on the second wiring layer.

Next, a method of manufacturing a semiconductor device according to this embodiment will be described with reference to FIGS. 2A to 5C.

Figure 2A:
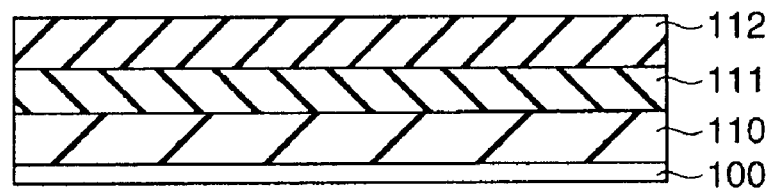
FIGS. 2A to 2E are cross-sectional views to illustrate a process of manufacturing the semiconductor device according to the first embodiment.

Firstly, as shown in FIG. 2A, the first ILD film 110, made of SiOC and SiO$_2$ and having a thickness of 100 nm, is formed on the Si substrate 100.

Subsequently, the bulk dielectric film 111, made of an organic material and having a thickness of 100 nm, and the cap dielectric film 112, made of SiOC and having a thickness of 50 nm, are sequentially formed thereon as the inter-wiring dielectric films used to form embedded wiring.

Figure 2B:
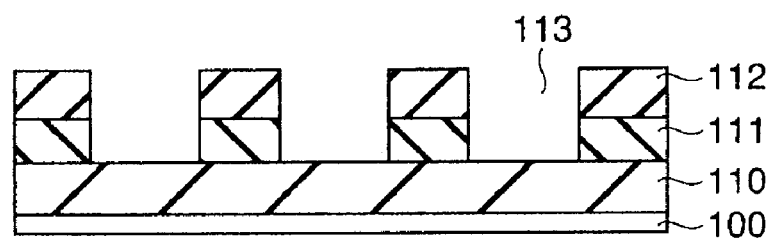

Then, as shown in FIG. 2B, a resist pattern (not shown) is formed on the inter-wiring dielectric films, and the wiring trenches 113 are formed therein by reactive ion etching.

Figure 2C:
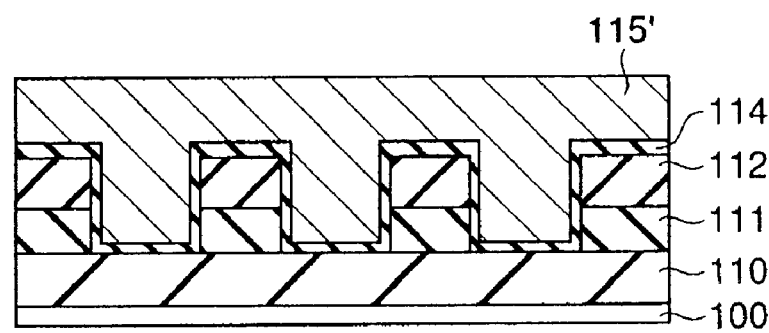

Subsequently, as shown in FIG. 2C, the wiring trenches 113 are filled with a barrier metal 114 and a wiring material 115'. Here, Cu is used as the wiring material, and Mn is used as the barrier metal instead of Ta or Ti. Specifically, after a CuMn film 114 containing Mn is formed thinly (as thin as 50 nm, for example) by sputtering, a Cu film 115' having a thickness of 1000 nm is formed by using the CuMn film 114 as a seed to be plated with Cu as the wiring material. A Cu seed metal may be provided on the CuMn film 114.

Figure 2D:
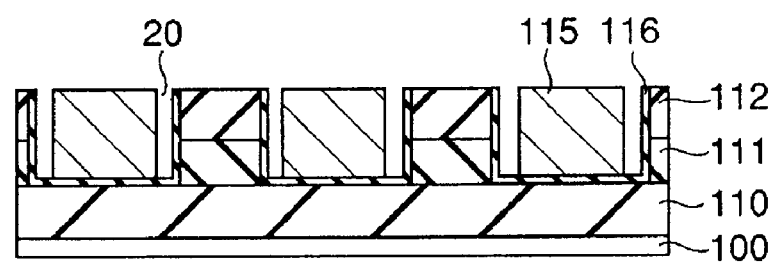

Then, as shown in FIG. 2D, at the interfaces between the Cu film 115' and the ILD film 110, the first barrier layers 116 are formed by annealing. The first barrier layers 116 is also provided between the top surface of the ILD film 110 and the bottom of the Cu film 115'. Subsequently, the Cu film 115' is polished by CMP so that the Cu wirings 115 can be formed in the wiring trenches 113, and that the gaps 20 can be formed between each Cu wiring 115 and the first barrier layers 116 provided.

Here, the steps shown in FIGS. 2C to 2D will be described in more detail with reference to FIGS. 5A to 5C. FIG. 5A shows the same state as shown in FIG. 2C, where the Cu film 115' is embedded in the wiring trenches 113 of the inter-wiring dielectric films 111 and 112.

As shown in FIG. 5B, by annealing the stacked structure in this state, Mn in the CuMn alloy 114 is bonded to O and Si in the dielectric films 110, 111 and 112. So, the barrier layers 116 made of MnSixOy or MnOx are formed between the dielectric films 110, 111 and 112 and the layer 114 which contains Mn.

In this event, O atom in the dielectric films diffuses toward the Cu film 115', and consequently, CuOx films 117 are also formed at the respective interfaces between the barrier layers 116 and the Cu film 115'.

In addition, the excess Mn, which is not used to form MnSixOy or MnOx, diffuses in the Cu film 115'. Thus, the wiring sidewalls have a Cu/CuOx/MnSixOy (MnOx) film-lamination structure.

Then, as shown in FIG. 5C, excess portions of the barrier layers 116 and the excess wiring material of Cu, which are deposited above the top of the wiring trenches, are removed by CMP, so that the Cu wirings 115 are formed in the wiring trenches 113. In this CMP process, acid slurry is used. Thus, the CuOx films 117 formed on the sidewalls of the Cu wirings 115 are dissolved, and consequently, the gaps 20 each having a width of approximately 10 nm are formed at the Cu/MnSixOy (MnOx) interfaces. Here, the CuOx films 117 may not be necessarily removed during this CMP process, but may be removed after the CMP process, instead.

Figure 2E:
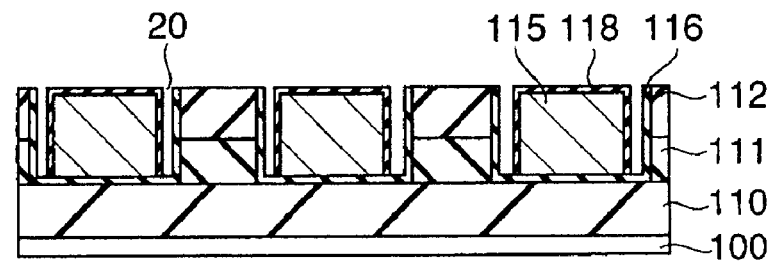

After that, as shown in FIG. 2E, CuSiN films to function as the second barrier layers 118 are formed. The CuSiN films function as protecting exposed surfaces of the Cu wirings 115. Specifically, the CuSiN films 118 are formed as thin (2 to 3 nm) films by processing the Cu wirings 115 with SiH4 to form a silicide thereon, and thereafter performing nitriding treatment with NH3 on the Cu wirings 115. This structure is characterized in that each Cu wiring 115 has a Cu/CuSiN/gap/MnSixOy (MnOx) lamination structure, and covered with the two dielectric film barriers respectively made of CuSiN and MnSixOy (MnOx). Thus, the Cu wiring 115 in this embodiment has an advantage of being highly water resistant.

Figure 3A:
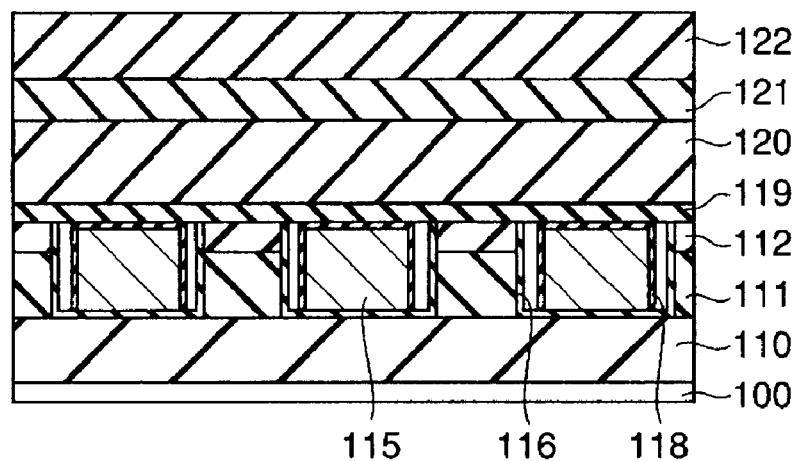
FIGS. 3A to 3C are cross-sectional views to illustrate the process of manufacturing the semiconductor device according to the first embodiment.

Then, as shown in FIG. 3A, on the first wiring layer thus formed on the substrate 100, the diffusion prevention film 119, made of SiN or SiC and having a thickness of 30 nm, is formed. The diffusion prevention film 119 functions as an etching stopper. Subsequently, the second ILD film 120 is formed on the diffusion prevention film 119, and the bulk dielectric film 121 and the cap dielectric film 122 are sequentially formed thereon as the inter-wiring dielectric films by the same method used for forming the inter-wiring dielectric films 111 and 112 in the first wiring layer.

Figure 3B:
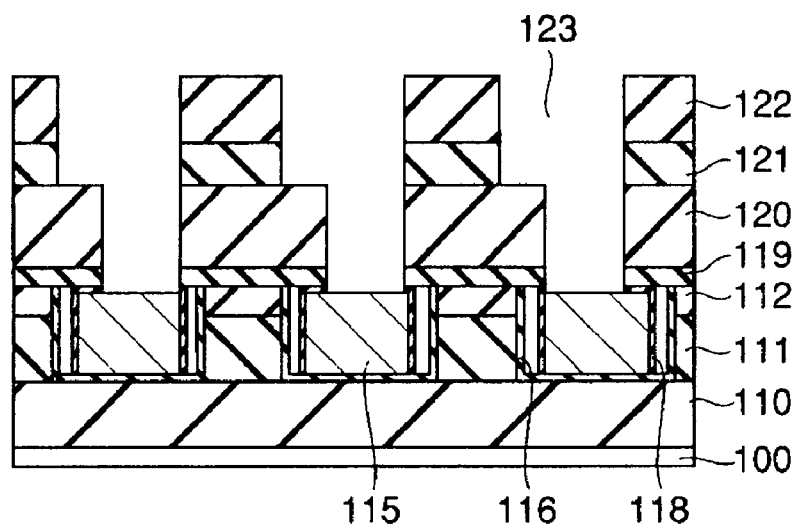

Then, as shown in FIG. 3B, a resist pattern is formed on the inter-wiring dielectric films, and the wiring trenches 123 are formed therein by reactive ion etching, as in the first wiring layer. In this event, the via holes communicating with the respective wiring trenches 123 are also formed in the ILD film 120.

Figure 3C:
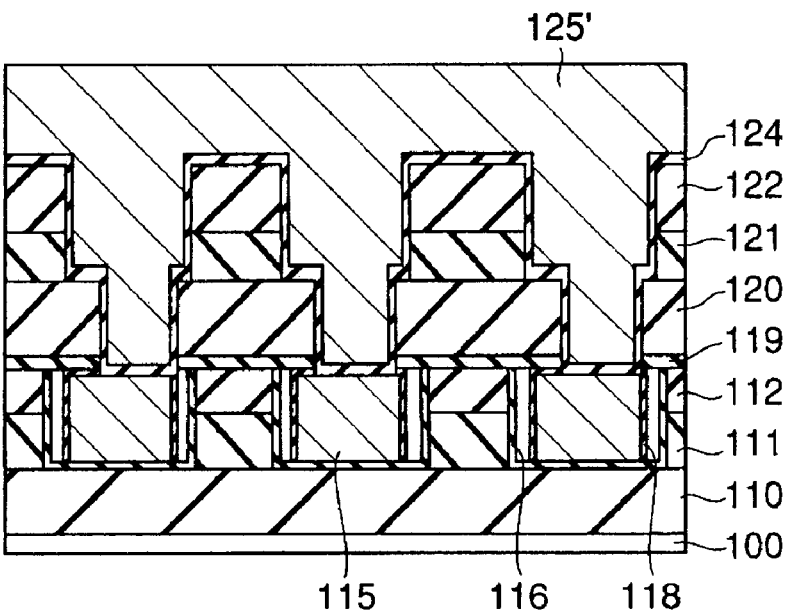

Then, as shown in FIG. 3C, a CuMn film 124 and a Cu film 125' are formed to cover the wiring trenches 123 as in the first wiring layer.

Figure 4A:
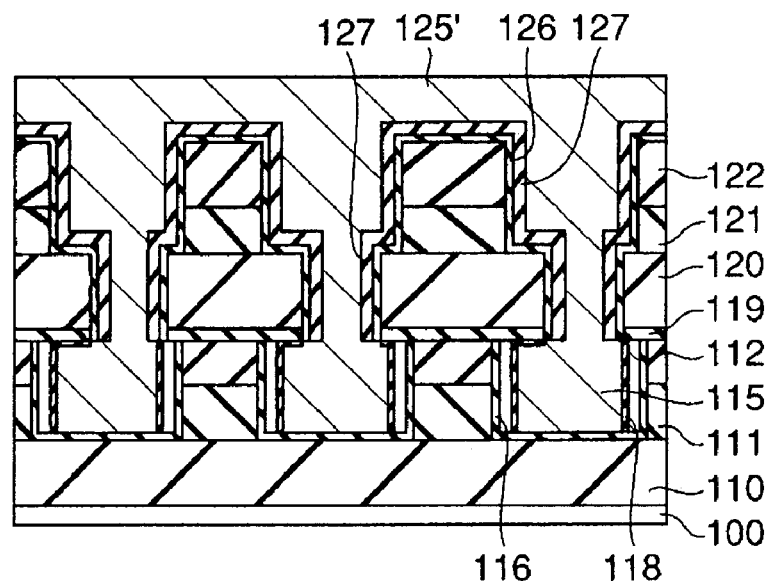
FIGS. 4A to 4C are cross-sectional views to illustrate the process of manufacturing the semiconductor device according to the first embodiment.

After that, as shown in FIG. 4A, the first barrier layers 126 and CuOx films 127 are formed by annealing as in the first wiring layer.

Figure 4B:
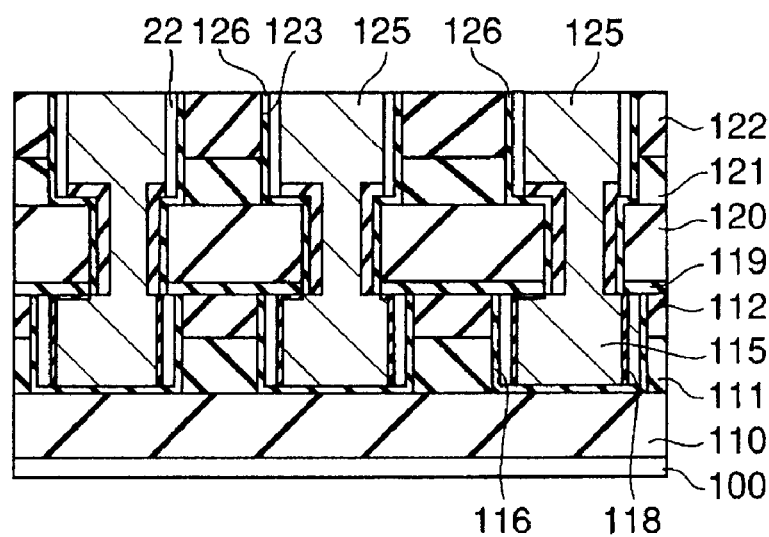

Subsequently, as shown in FIG. 4B, the Cu film 125' is polished by CMP so that the Cu wirings 125 can be formed to be embedded in the respective wiring trenches 123, and that the gaps 22 can be formed between each Cu wiring 125 and the wiring trench 123 provided therefor, as in the first wiring layer.

Figure 4C:
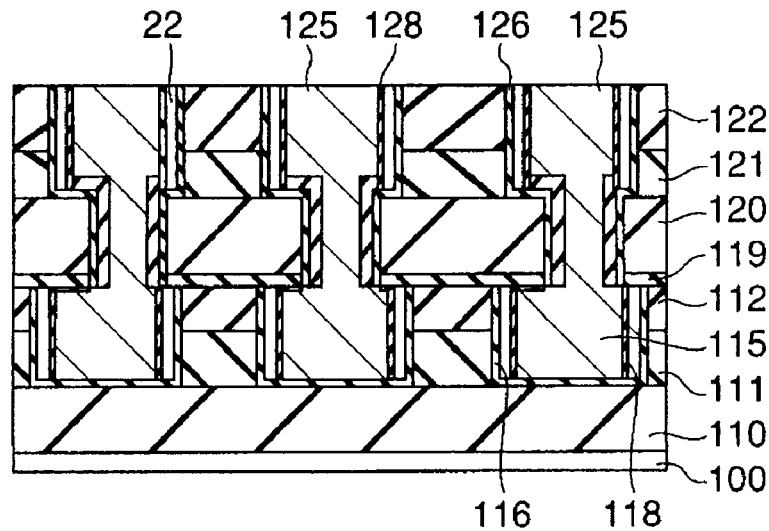

Then, as shown in FIG. 4C, CuSiN films to serve as the second barrier layers 128 are formed to protect exposed surfaces of the Cu wirings 125, as in the first wiring layer.

After that, the diffusion prevention film 129, made of SiOC or the like, is formed thereon, and thus the semiconductor device having the structure shown in foregoing FIG. 1 is formed.

As described above, the gaps 20 are provided between each Cu wiring 115 and the side surfaces of the wiring trench 113 provided therefor, in this embodiment. This can reduce wiring capacity while preventing corrosion of the Cu wirings 115 caused by moisture in the dielectric films 111 and 112. Similarly, the gaps 22 are also provided between each Cu wiring 125 and the side surfaces of the wiring trench 123 provided therefor, in this embodiment. This can reduce wiring capacity while suppressing corrosion of the Cu wirings 125 caused by moisture in the dielectric films 121 and 122.

In addition, the barrier layers 118, made of CuSiN, are formed on the upper and side surfaces of the Cu wirings 115, and similarly, the barrier layers 128 are also formed on the upper and side surfaces of the Cu wirings 125. This can further suppress wiring corrosion caused by moisture in the dielectric films 111, 112, 121 and 122. Moreover, the barrier layers 116 and 126, made of MnSixOy or MnOx, are formed on the side surfaces of the wiring trenches 113 and 123. This can prevent moisture from penetrating into the Cu wirings 115 from the dielectric films 111, 112, 121 and 122, and thus more reliably suppress wiring corrosion. Furthermore, the barrier layers 116, made of MnSixOy or MnOx, are formed at the interfaces between the Cu wirings 115 and the ILD film 110, and similarly, the barrier layers 126 are formed at the interfaces between the Cu wirings 125 and the ILD film 120. This can prevent reactions between the wiring layers 115 and the ILD film 110 as well as between the wiring layers 125 and the ILD film 120. Thus, highly reliable embedded wiring can be obtained.

Second Embodiment

Figure 6:
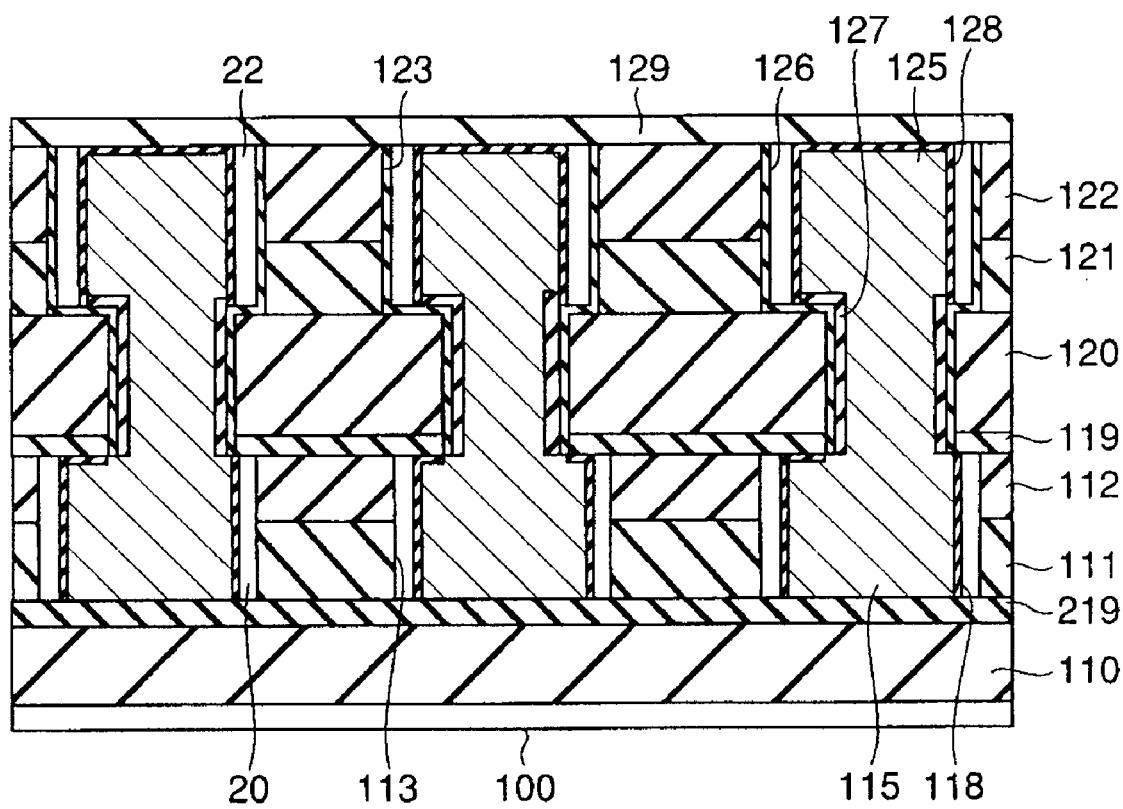
FIG. 6 is a cross-sectional view showing a wiring structure of a semiconductor device according to a second embodiment.

FIG. 6 is a cross-sectional view showing a wiring structure of a semiconductor device according to a second embodiment. Note that the same parts as in FIG. 1 are denoted by the same reference numerals, and detailed description thereof will be omitted.

This embodiment is different from the first embodiment in that a diffusion prevention film 219 is formed as an underlying layer of the first wiring layer and that the barrier layers 116 are not formed.

Specifically, the diffusion prevention film 219 is formed on the first ILD film 110, and the bulk dielectric film 111 and the cap dielectric film 112 are deposited thereon as the first inter-wiring dielectric films, as in the first embodiment. In addition, the wiring trenches 113 are formed in the inter-wiring dielectric films 111 and 112, and the Cu wiring 115 is formed in each of the trenches 113, as in the first embodiment. The gaps 20 are provided between the Cu wiring 115 and the sidewalls of the wiring trench 113, and the second barrier layers 118, made of CuSiN, are formed on the upper and side surfaces of the Cu wirings 115. However, the barrier layers 116, which are formed in the first embodiment, are not formed in this embodiment. On the first wiring layer thus formed on the substrate 100, the diffusion prevention film 119 is formed.

The second wiring layer is formed as in the first embodiment. Specifically, the second ILD film 120 and the second inter-wiring dielectric films 121 and 122 are sequentially deposited on the diffusion prevention film 119. The wiring trenches 123 are formed in the inter-wiring dielectric films 121 and 122, and the via holes are formed in the ILD film 120. The Cu wiring 125 is formed in each of the wiring trenches 123 and the via holes. Between the Cu wiring 125 and the sidewalls of the wiring trench 123, the gaps 22 are provided.

At the interfaces between the Cu wirings 125 and the ILD film 120 as well as on the side surfaces of the wiring trenches 123, the first barrier layers 126, made of MnOx films or MnSixOy films, are formed. On the upper and side surfaces of the Cu wirings 125, the second barrier layers 128, made of CuSiN, are formed. In addition, in the via holes of the ILD film 120, the CuOx films 127 are formed between each Cu wiring 125 and the adjacent barrier layers 126. On the second wiring layer thus formed on the substrate 100, the diffusion prevention film 129 is formed.

Next, a method of manufacturing a semiconductor device according to this embodiment will be described with reference to FIGS. 7A to 8C.

Figure 7A:
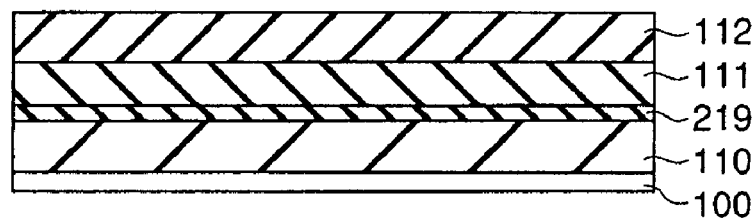
FIGS. 7A to 7E are cross-sectional views to illustrate a process of manufacturing the semiconductor device according to the second embodiment.

Firstly, as shown in FIG. 7A, the first ILD film 110 is formed on the Si substrate 100, and the diffusion prevention film 219, made of SiN or SiC, is formed thereon. On the diffusion prevention film 219, the bulk dielectric film 111, made of an organic material, and the cap dielectric film 112, made of SiOC, are sequentially formed thereon as the inter-wiring dielectric films used to form embedded wiring. Note that the thickness of each film is basically the same as the corresponding film in the first embodiment.

Figure 7B:
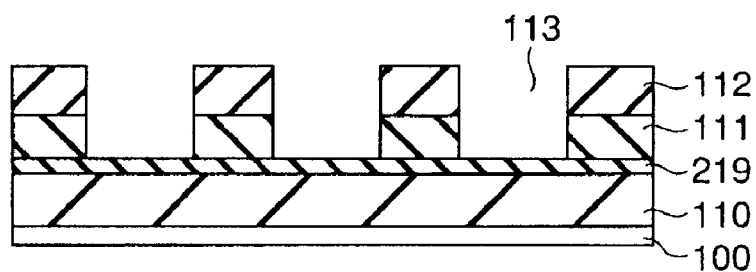

Then, as shown in FIG. 7B, a resist pattern is formed on the inter-wiring dielectric films, and the wiring trenches 113 are formed therein by reactive ion etching.

Figure 7C:
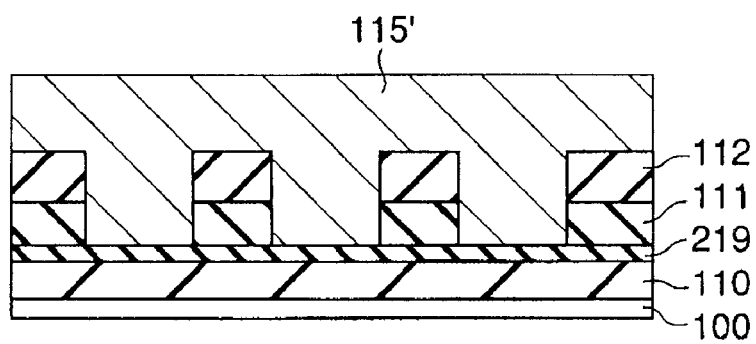

Subsequently, as shown in FIG. 7C, the wiring trenches 113 are filled with a wiring material. Here, the wiring trenches 113 plated with Cu as the wiring material. Specifically, after a Cu film to serve as a seed is formed, the Cu film 115' is formed by plating the seed with Cu as the wiring material.

Figure 7D:
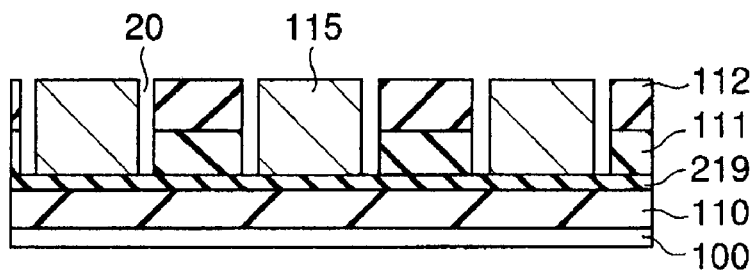

Then, as shown in FIG. 7D, after annealing is performed, the Cu film 115' is polished by CMP so that the Cu wirings 115 can be formed only in the wiring trenches 113, and that the gaps 20 can be formed between each Cu wiring 115 and the wiring trench 113 provided therefor.

Figure 8A:
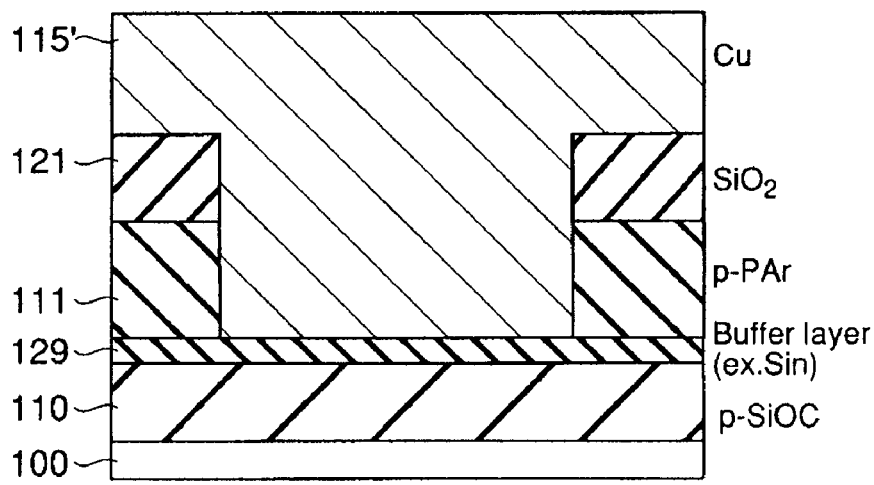
FIGS. 8A to 8C are schematic diagrams to illustrate a mechanism of forming gaps in the second embodiment.

Here, the steps shown in FIGS. 7C to 7D will be described in more detail with reference to FIGS. 8A to 8C. FIG. 8A shows the same state as shown in FIG. 7C, where the Cu film 115' is embedded in the wiring trenches 113 of the inter-wiring dielectric films 111 and 112.

Figure 8B:
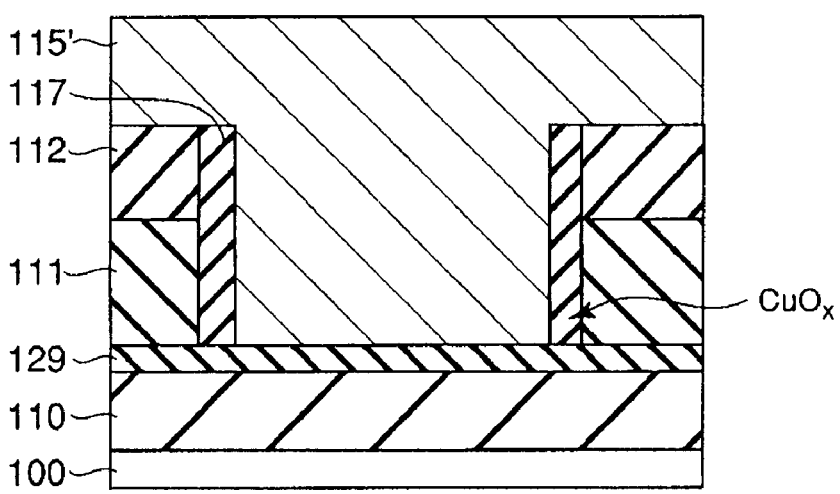

As shown in FIG. 8B, by annealing the stacked structure in this state, a large amount of moisture in the dielectric films diffuses toward the Cu film 115', and consequently, the CuOx films 117 are formed at the interface between the dielectric films 111 and 112 and the Cu film 115'. Thus, the wiring sidewalls have a Cu/CuOx film-stacked structure.

Figure 8C:
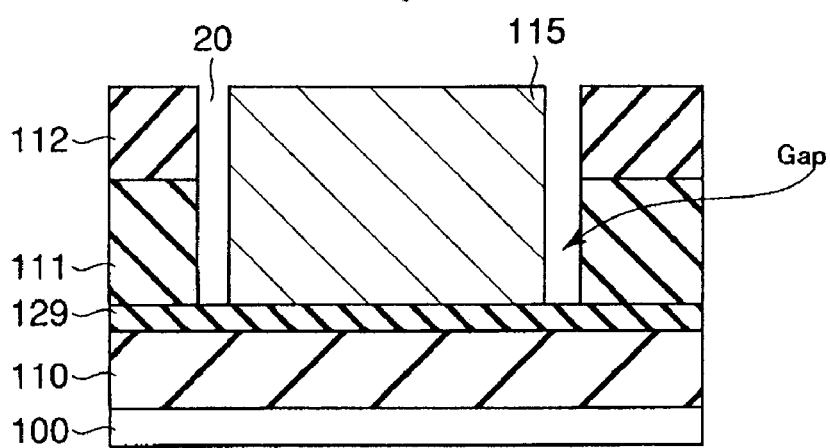

Then, as shown in FIG. 8C, excess portions of Cu, which are deposited above the top of the wiring trenches, are removed by CMP, so that the Cu wirings 115 are formed only in the wiring trenches 113. In this CMP process, acid slurry is used. Thus, the CuOx films 117 formed on the sidewalls of the Cu wirings 115 are dissolved, and consequently, the gaps 20 each having a width of approximately 10 nm are formed between each Cu wiring 115 and the side surfaces of the wiring trench 113 provided therefor. Note that the CuOx films 117 may be removed after the CMP process, instead.

Figure 7E:
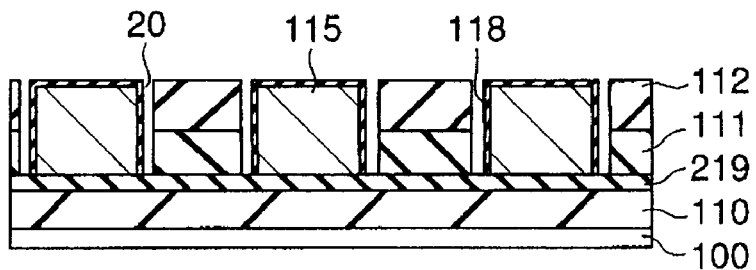

After that, as shown in FIG. 7E, the CuSiN films to serve as the second barrier layers 118 are formed to protect exposed surfaces of the Cu wirings 115, as in the first embodiment. This structure is characterized in that each Cu wiring 115 has a Cu/CuSiN/gap/dielectric film structure, and that the upper and side surfaces thereof are covered with the dielectric film barrier made of CuSiN. Thus, the Cu wiring 115 in this embodiment has an advantage of being highly water resistant.

After that, the diffusion prevention film 119, the second ILD film 120, the second inter-wiring dielectric films 121 and 122, the wiring trenches 123 and the Cu wirings 125 are formed as with formation of the first wiring layer, though not shown. Note that, unlike in the first wiring layer, the Cu film 125' is formed by using the CuMn film 124 as a seed, and the barrier layers 126, made of MnSixOy or MnOx, are formed on the side surfaces of the wiring trenches 123, to form the second wiring layer as in the first embodiment. Thereafter, the barrier layers 128, made of CuSiN, and then the diffusion prevention film 129, made of SiOC or the like, are formed. Thereby, the second wiring layer is formed, and thus the semiconductor device having the structure shown in foregoing FIG. 6 is formed.

As described above, the gaps 20 are provided between each Cu wiring 115 and the side surfaces of the wiring trench 113 provided therefor, in this embodiment. In addition, the gaps 22 are also provided between each Cu wiring 125 and the side surfaces of the wiring trench 123 provided therefor. This can reduce wiring capacity while preventing corrosion of the Cu wirings 115 and 125 caused by moisture in the dielectric films 111, 112, 121 and 122.

In addition, the barrier layers 118 and 128, made of CuSiN, are formed on the upper and side surfaces of the Cu wirings 115 and 125. This can further suppress metal corrosion caused by moisture in the dielectric films 111, 112, 121 and 122. Moreover, the diffusion prevention film 219, which is formed as the underlying layer of the Cu wirings 115, prevents reactions between the Cu wirings 115 and the ILD film 110 in place of the barrier layers 116. Furthermore, the barrier layers 126, made of MnSixOy or MnOx, are formed on the side surfaces of the wiring trenches 123. This can suppress metal corrosion more reliably.

Thus, highly reliable wiring can be obtained.

Third Embodiment

Figure 9:
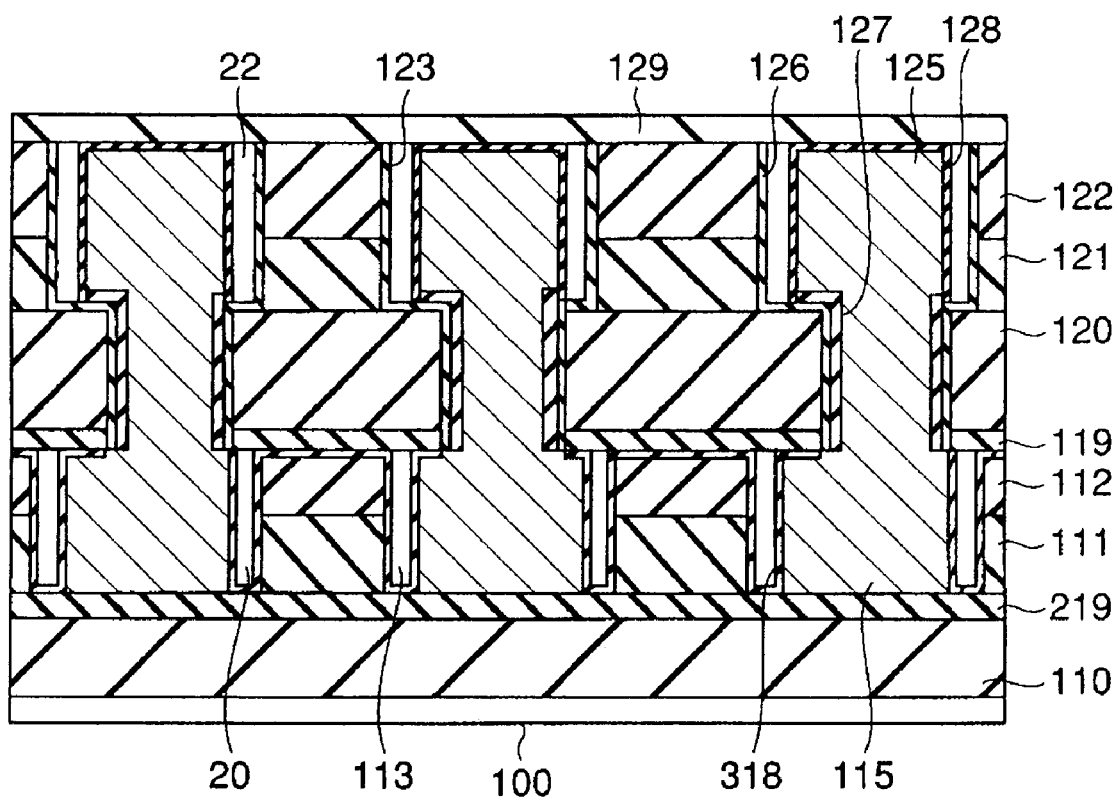
FIG. 9 is a cross-sectional view showing a wiring structure of a semiconductor device according to a third embodiment.

FIG. 9 is a cross-sectional view showing a wiring structure of a semiconductor device according to a third embodiment. Note that the same parts as in FIG. 6 are denoted by the same reference numerals, and detailed description thereof will be omitted.

This embodiment is different from the second embodiment in that the barrier layers to protect the Cu wiring are made of alumina (AlO) in place of CuSiN.

Specifically, the diffusion prevention film 219 is formed on the ILD film 110, and the bulk dielectric film 111 and the cap dielectric film 112 are deposited thereon as the first inter-wiring dielectric films. In addition, the wiring trenches 113 are formed in the inter-wiring dielectric films 111 and 112, and the Cu wiring 115 is formed in each of the trenches 113, as in the first embodiment. The gaps 20 are provided between the Cu wiring 115 and the sidewalls of the wiring trench 113, and barrier layers 318 made of AlO are formed on the upper and side surfaces of the Cu wirings 115 as well as the side surfaces of the wiring trenches 113.

In the second embodiment, the barrier layers 118 are formed by silicidation on the exposed surfaces of the Cu wirings 115. By contrast, the barrier layers 318, made of AlO, are formed on the entire exposed surfaces in this embodiment. In other words, the barrier layers 318, made of AlO, are formed on the upper and side surfaces of the Cu wirings 115, the upper and side surfaces of the wiring trenches 113, and exposed surfaces of the diffusion prevention film 219. On the first wiring layer thus formed on the substrate 100, the diffusion prevention film 119 is formed. The structure of the second wiring layer is the same as those in the first and second embodiments.

Next, a method of manufacturing a semiconductor device according to this embodiment will be described with reference to FIGS. 10A to 10E.

Figure 10A:
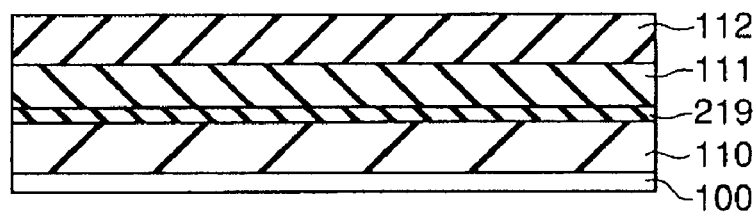
FIGS. 10A to 10E are cross-sectional views to illustrate a process of manufacturing the semiconductor device according to the third embodiment.
Figure 10B:
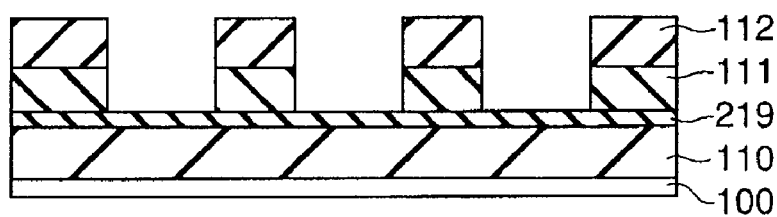
Figure 10C:
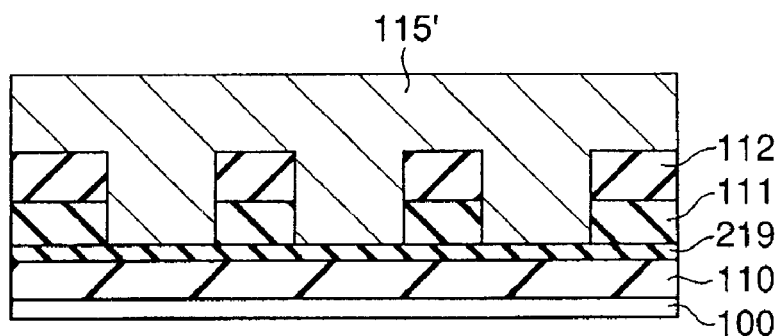
Figure 10D:
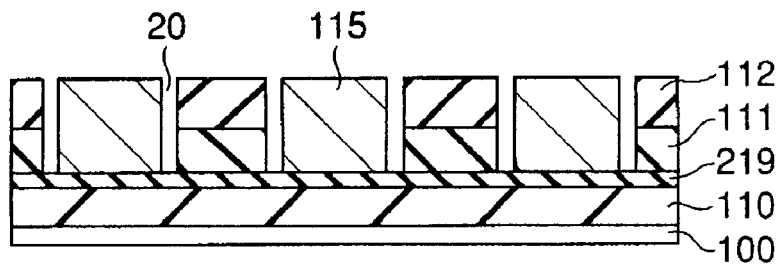
Figure 10E:
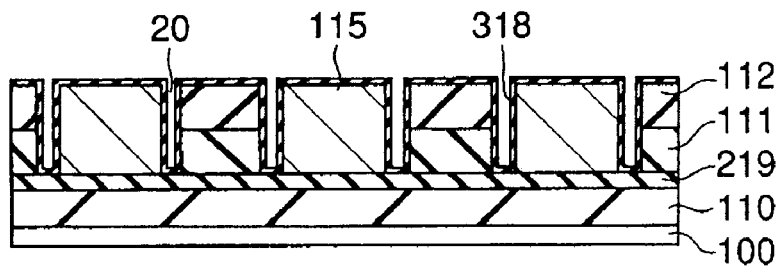

The steps shown in FIGS. 10A to 10D are the same as those in foregoing FIGS. 7A to 7D. After that, as shown in FIG. 10E, the barrier layers 318, made of AlO films, are formed to protect exposed surfaces of the Cu wirings 115 by forming and annealing a thin Al film. In this step, the barrier layers 318 are formed not only on the upper and side surfaces of the Cu wirings 115, but also on the upper and side surfaces of the wiring trenches 113. Note that the AlO films are formed by atomic layer deposition (ALD), for example, and each have a thickness of 2 nm.

This structure is characterized in that each Cu wiring 115 has a Cu/AlOx/gap/AlOx/dielectric film lamination structure, and that the upper and side surfaces thereof are covered with the dielectric film barrier made of AlOx. Thus, the Cu wiring 115 in this embodiment has an advantage of being highly water resistant.

After that, the steps as in the first and second embodiments are performed, though not shown, and thus the semiconductor device having the structure shown in foregoing FIG. 9 is formed.

As described above, the gaps 20 are provided between each Cu wiring 115 and the side surfaces of the wiring trench 113 provided therefor, in this embodiment. In addition, the gaps 22 are also provided between each Cu wiring 125 and the side surfaces of the wiring trench 123 provided therefor. This can reduce wiring capacity while preventing corrosion of the Cu wirings 115 and 125 caused by moisture in the dielectric films 111, 112, 121 and 122.

In addition, the barrier layers 318, made of AlO, are formed on the upper and side surfaces of the Cu wirings 115, and even on the side surfaces of the wiring trenches 113. This can further suppress metal corrosion caused by moisture in the dielectric films 111 and 112. Moreover, the barrier layers 128, made of CuSiN, are formed on the upper and side surfaces of the Cu wirings 125, and the barrier layers 126, made of MnSixOy or MnOx, are formed on the side surfaces of the wiring trenches 123. This can suppress metal corrosion more reliably. Furthermore, the diffusion prevention film 219, which is formed as the underlying layer of the Cu wirings 115, prevents reactions between the Cu wirings 115 and the ILD film 110 in place of the barrier layers 116. Thus, highly reliable wiring can be obtained.

Fourth Embodiment

Figure 11:
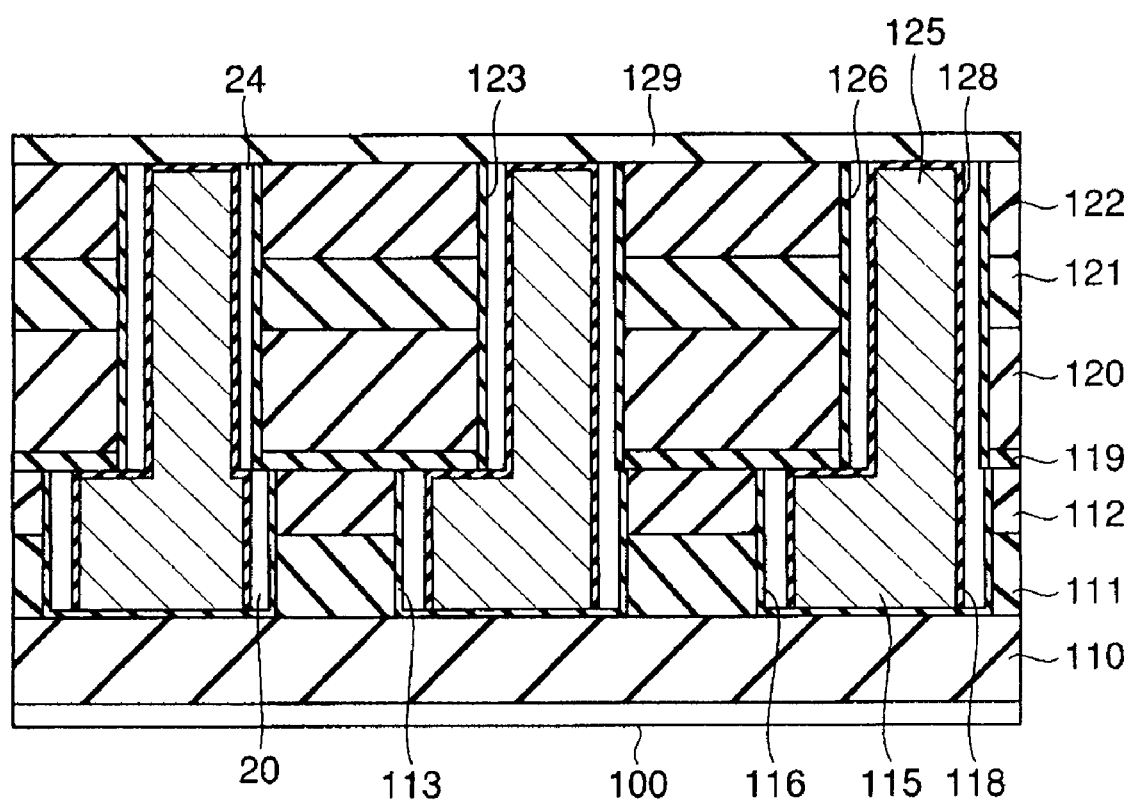
FIG. 11 is a cross-sectional view showing a wiring structure of a semiconductor device according to a fourth embodiment.

FIG. 11 is a cross-sectional view showing a wiring structure of a semiconductor device according to a fourth embodiment. Note that the same parts as in FIG. 1 are denoted by the same reference numerals, and detailed description thereof will be omitted.

This embodiment is different from the foregoing first embodiment in that the Cu wirings 115 are spaced apart from the interlayer dielectric film 120 as well in the second wiring layer.

Specifically, the gaps 20 are provided between each Cu wiring 115 and the sidewalls of the wiring trench 113 provided therefor, and the second barrier layers 118 made of CuSiN are formed on the upper and side surfaces of the Cu wirings 115. On the first wiring layer thus formed on the substrate 100, the diffusion prevention film 119 is formed.

The second ILD film 120 and the second inter-wiring dielectric films 121 and 122 are sequentially deposited on the diffusion prevention film 119. The wiring trenches 123 are formed in the inter-wiring dielectric films 121 and 122, and the via holes are formed in the ILD film 120. Here, the width of each wiring trench 123 is set as long as the diameter of each via hole, and thus each wiring trench 123 is formed to communicate with the via hole formed below.

The Cu wirings 125 are formed to be embedded in the wiring trenches 123 and the via holes, and gaps 24 are formed between each Cu wiring 125 and the adjacent sidewalls of the wiring trench 123 and the via hole. On the side surfaces of the wiring trenches 123 and the side surfaces of the via holes, the first barrier layers 126, made of MnOx films or MnSixOy films, are formed. On the upper and side surfaces of the Cu wirings 125, the second barrier layers 128, made of CuSiN, are formed. Here, in this embodiment, the CuOx films 127 formed between each Cu wiring 125 and the adjacent barrier layers 126 are removed also in the via holes of the ILD film 120, and thus the gaps 24 are formed. On the second wiring layer thus formed on the substrate 100, the diffusion prevention film 129 is formed.

Next, a method of manufacturing a semiconductor device according to this embodiment will be described with reference to FIGS. 12A to 13C.

Figure 12A:
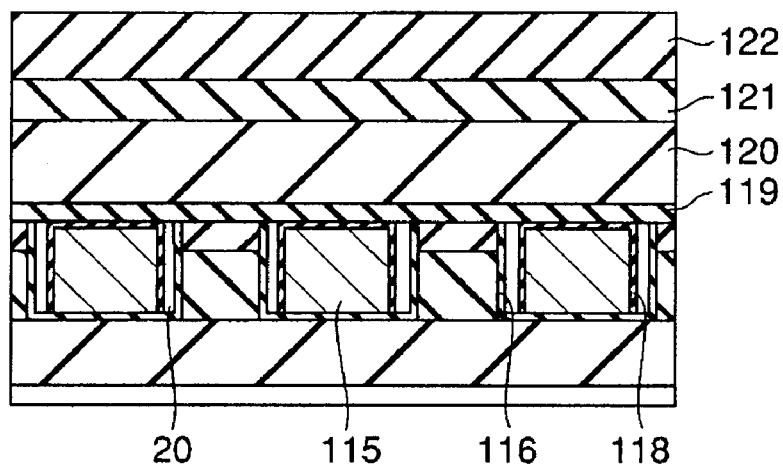
FIGS. 12A to 12C are cross-sectional views to illustrate a process of manufacturing the semiconductor device according to the fourth embodiment.

FIG. 12A is the same as the foregoing FIG. 3F, and the steps shown in FIGS. 2A to 3F are performed in this embodiment, as in the first embodiment.

Figure 12B:
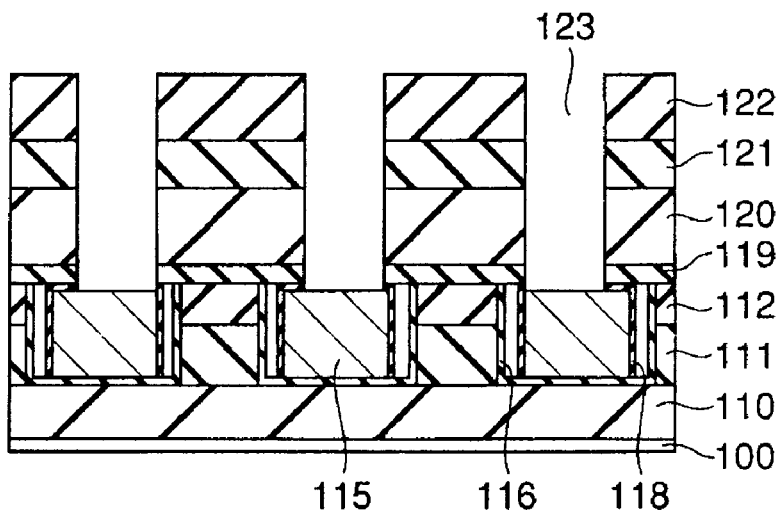

In this embodiment, subsequent to these steps, a resist pattern is formed on the inter-wiring dielectric films as in the first wiring layer, and the wiring trenches 123 are formed therein and the via holes are formed in the ILD film 120 by reactive ion etching, as shown in FIG. 12B. Here, the width of each wiring trench 123 is set as long as the diameter of each via hole, and thus each wiring trench 123 is formed to communicate with the via hole formed below.

Figure 12C:
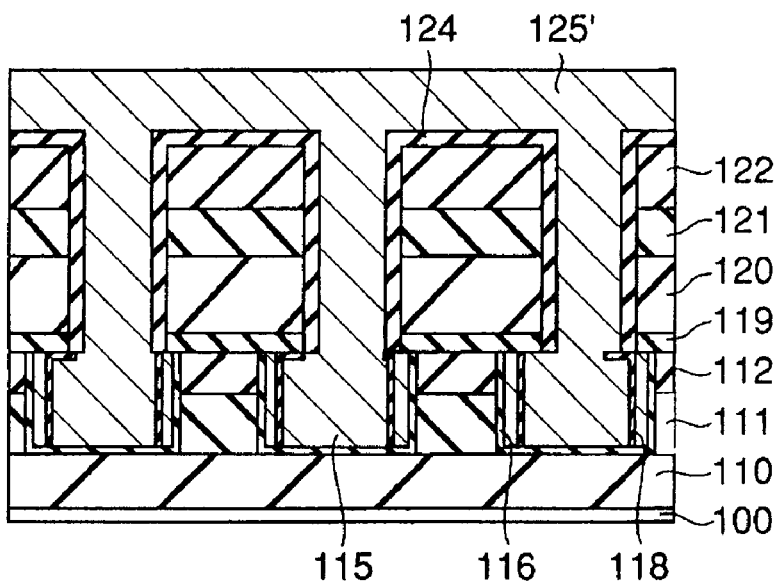

Then, as shown in FIG. 12C, the CuMn film 124 and the Cu film 125' are formed to cover the wiring trenches 123 as in the first wiring layer.

Figure 13A:
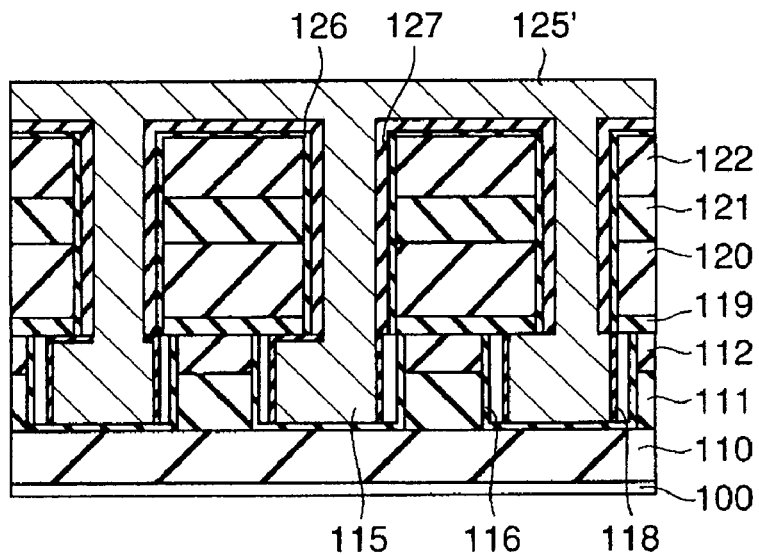
FIGS. 13A to 13C are cross-sectional views to illustrate the process of manufacturing the semiconductor device according to the fourth embodiment.

After that, as shown in FIG. 13A, the barrier layers 126 and the CuOx films 127 are formed by annealing.

Figure 13B:
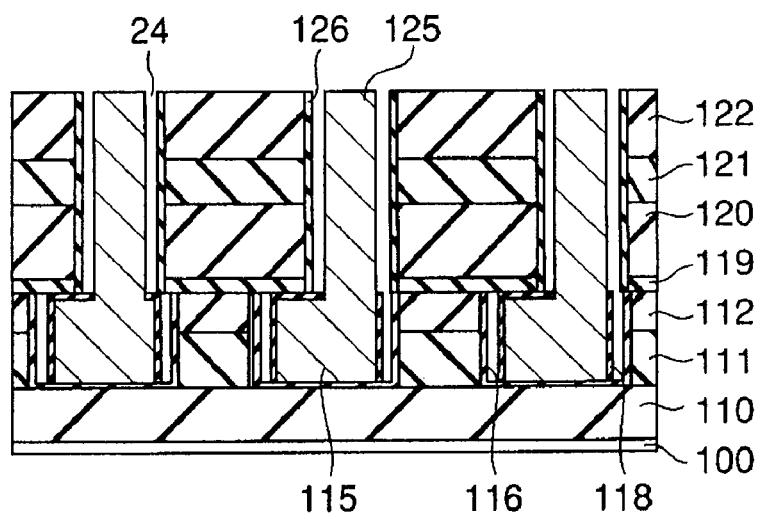

Subsequently, as shown in FIG. 13B, the Cu film 125' is polished by CMP so that the Cu wirings 125 can be formed to be embedded in the wiring trenches 123 and the via holes, and that the gaps 24 can be formed between each Cu wiring 125 and the side surfaces of the wiring trench 123 and the via hole that are provided therefor. In this event, each side surface of the wiring trenches 123 is formed continuously to the side surface located below of the via holes. Accordingly, the CuOx films 127 can be surely removed in the via holes as well, and thus the continuous gaps 24 are formed.

Figure 13C:
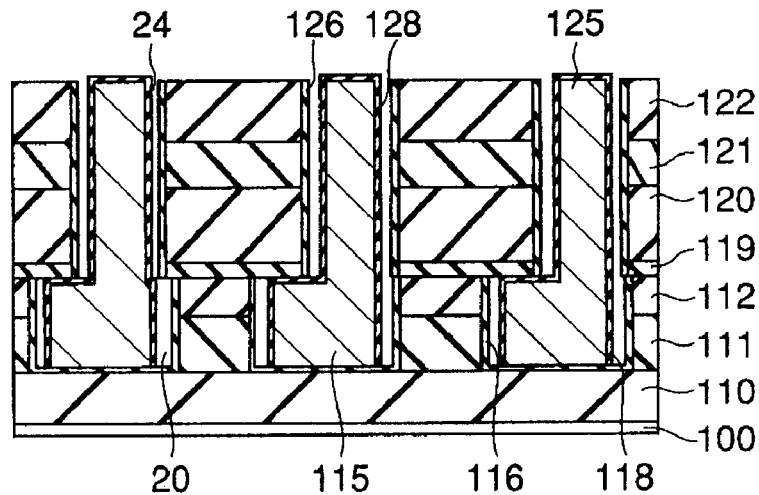

Then, as shown in FIG. 13C, the CuSiN films to serve as the second barrier layers 128 are formed to protect the exposed surfaces of the Cu wirings 125. Since the gaps 24 are continuously formed in each wiring trench 123 and the via hole below, the Cu wiring films 125 in the second wiring layer are prevented from contacting the dielectric films 120, 121 and 122.

After that, the diffusion prevention film 129, made of SiOC or the like, is formed as in the first embodiment, and thus the semiconductor device having the structure shown in foregoing FIG. 11 is formed.

As described above, this embodiment provides not only the same effects as the foregoing first embodiment, as a matter of course. In addition, the Cu wirings 125 can be prevented from contacting the ILD film 120 as in the via portions in this embodiment. This can suppress metal corrosion in these portions. Accordingly, corrosion can be more reliably prevented even in the second wiring layer, and thus more highly reliable wiring can be obtained.

Note that the present invention is not limited to the foregoing embodiments. For example, though the CuMn alloy is used as the seed layer in the first embodiment, another metal, such as Mg may be used in place of Mn. In this case, the first barrier layer made of MgO is formed by annealing.

In addition, though Al oxide films are formed as the barrier layers in the third embodiment, films made of another metal oxide may be formed as the barrier layers, instead. Specifically, any metal can be used as the barrier layers as long as the metal can be formed into a thin film that can be surely formed into a dielectric film by oxidation, and has a sufficiently high moisture resistance. For example, Ti oxide films can be used.

In addition, the wiring material is not necessarily limited to Cu, but other metal material, such as Al, can be used. Moreover, though the first and second wiring layers have the same structure in each of the foregoing embodiments, the first and second wiring layers may employ different structures using different layers obtained by combining the embodiments as needed.

In one aspect of the present invention, a method of manufacturing a semiconductor device, may include forming an inter-wiring dielectric film having a wiring trench, forming a wiring layer in the wiring trench in the inter-wiring dielectric film, forming a metal oxide film between the wiring layer and a side surface of the wiring trench, the metal oxide film having a metal element in the wiring layer, removing the metal oxide film, and thereby forming a gap between the wiring layer and the side surface of the wiring trench and forming a water-resistant barrier layer on side surface of the wiring layer that is exposed to the gap. The water-resistant barrier layer may be CuSiN or AlO. The water-resistant barrier layer may be also formed on a side surface of the wiring trench that is exposed to the gap.

In addition, the embodiments may be modified in various ways within the gist of the present invention.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device, comprising:
   an inter-wiring dielectric film in which a wiring trench is formed;
   a metal wiring layer formed in the wiring trench in the inter-wiring dielectric film;
   a first barrier layer formed on a side surface of the wiring trench, the first barrier layer being an oxide film made from a metal different from a main constituent metal element in the wiring layer;

a second barrier layer formed on a side surface of the wiring layer, the second barrier layer having a Si atom and a metal element in the wiring layer; and a gap formed between the first barrier layer and the second barrier layer.

2. The semiconductor device of claim 1 wherein the wiring layer is Cu, and the first barrier layer is MnOx or MnSixOy.

3. The semiconductor device of claim 1, wherein the wiring layer is Cu, and the second barrier layer is CuSiN.

4. The semiconductor device of claim 1, wherein the wiring layer is Cu, the first barrier layer is MnOx or MnSixOy and the second barrier layer is CuSiN.

5. A semiconductor device, comprising:

an inter-wiring dielectric film in which a wiring trench is formed;

a metal wiring layer formed in the wiring trench in the inter-wiring dielectric film;

a water-resistant barrier layer formed on a side surface of the wiring layer and an upper surface of the wiring layer; and a gap formed between the water-resistant barrier layer and a side surface of the wiring trench.

6. The semiconductor device according to claim 5, wherein the water-resistant barrier layer is CuSiN or AlO.

7. The semiconductor device according to claim 5, wherein the water-resistant barrier layer is also provided on a side surface of the wiring trench which is adjacent to the gap.

8. The semiconductor device according to claim 7, wherein the water-resistant barrier layer is also provided on a bottom of the gap.

* * * * *